(12) United States Patent
Pashley et al.

(10) Patent No.: US 6,418,506 B1
(45) Date of Patent: *Jul. 9, 2002

(54) INTEGRATED CIRCUIT MEMORY AND METHOD FOR TRANSFERRING DATA USING A VOLATILE MEMORY TO BUFFER DATA FOR A NONVOLATILE MEMORY ARRAY

(75) Inventors: Richard D. Pashley, Roseville; Mark D. Winston, El Dorado Hills; Owen W. Jungroth, Sonora; David J. Kaplan, Santa Clara, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/777,898

(22) Filed: Dec. 31, 1996

(51) Int. Cl.$^7$ .......................... G06F 13/00; G11C 16/06
(52) U.S. Cl. ........................ 711/103; 710/52; 711/118
(58) Field of Search ................................ 711/103, 162, 711/118; 395/872; 365/228; 710/52

(56) References Cited

U.S. PATENT DOCUMENTS

| | | | | |
|---|---|---|---|---|
| 4,007,452 A | | 2/1977 | Hoff, Jr. ........................ 365/63 |
| 5,359,569 A | * | 10/1994 | Fujita et al. ................ 365/228 |
| 5,412,612 A | * | 5/1995 | Oyama ........................ 365/228 |
| 5,438,549 A | * | 8/1995 | Levy ........................... 365/228 |
| 5,488,711 A | * | 1/1996 | Hewitt et al. ................ 711/103 |
| 5,509,134 A | * | 4/1996 | Fandrich et al. ............ 711/103 |
| 5,530,828 A | * | 6/1996 | Kaki et al. ................... 711/103 |

FOREIGN PATENT DOCUMENTS

| | | |
|---|---|---|
| JP | 02-081398 | 3/1990 |
| JP | 02-089296 | 3/1990 |
| JP | 06-215589 | 8/1994 |

* cited by examiner

*Primary Examiner*—Glenn Gossage
(74) *Attorney, Agent, or Firm*—Blakely, Sokoloff, Taylor & Zafman LLP

(57) ABSTRACT

An integrated circuit (IC) memory device having an interface coupled with a volatile random access memory (RAM) array and a nonvolatile flash memory array. Data to be written from an external device to the IC memory device is initially written to the volatile RAM array to provide for fast execution of a write operation, and is then written from the volatile RAM array to the nonvolatile flash memory array via the interface in a manner that is relatively transparent to external devices and the user. The interface may be configured to transfer data from the volatile RAM array to the external device if a read request matches an address tag field stored in the volatile RAM array. Data from first and second block addresses in the volatile RAM array and flash memory array may be merged in a flash merge buffer, and validity bits may be used to ensure that potentially stale data in the flash memory array is not used and that data coherency is maintained. Data may also be simultaneously written to or read from the volatile RAM array during at least a portion of the time in which data is being read from or written to the flash memory array. A check may be made to ensure that the flash merge buffer is empty before reading data from the flash memory array.

9 Claims, 4 Drawing Sheets

INTEGRATED CIRCUIT MEMORY AND METHOD FOR TRANSFERRING DATA USING A VOLATILE MEMORY TO BUFFER DATA FOR A NONVOLATILE MEMORY ARRAY

FIELD OF THE INVENTION

The present invention relates to data storage technology in a computer system and, more particularly, to a combined volatile and nonvolatile memory device formed on the same semiconductor substrate, and an interface therefor.

BACKGROUND OF THE INVENTION

As the speed and capabilities of electronic devices continue to increase, so must the speed and capability of the memory components that support these devices. For example, in the past, computer systems, such as personal computers, telephones, fax machines, audio, video, and other electronic devices, were primarily stationary in nature, and were primarily supplied power through a local wall outlet. Today, however, and more increasingly in the future, many of these devices have become more miniaturized, and are supplied power from an internal battery, enabling these devices to enter the mobile market. This trend toward miniaturization and low-power battery operation necessarily extends to all aspects of these devices, including their electronic memory components.

As a specific example, consider the mobile cellular telephone. Market forces work to continually reduce the size of the cell phone while demanding increased capability. Early mobile phones weighed in excess of ten pounds and were the size of a briefcase. These phones did nothing more than allow a user to dial a number and communicate with a second party. Today, the weight of cellular phones is measured in ounces rather than pounds, and these phones incorporate advanced features such as, for example, name and number storage and security. In the near future, cellular phones will take on more personal digital assistant (PDA) features such as, for example, faxing, computing, internet access, messaging, scheduling, and handwriting and voice recognition.

To be marketable, each of these features will require more advanced memory technologies than what is currently available. The memory components that will support future mobile electronic devices need to have a large memory capacity, be quickly accessible, operate at low power, and maintain the integrity of stored data through power fluctuations, such as would occur when the battery is removed or its supply to the electronic device is otherwise interrupted.

One type of data storage medium is generically referred to as random access memory (RAM). Specific types of RAM include, for example, dynamic RAM (DRAM), static RAM (SRAM), video RAM (VRAM), and synchronous DRAM (SDRAM). These and other types of RAM storage devices share some common attributes. For example, data can be read from or written to locations in a RAM array relatively quickly in comparison to other types of memory devices. In addition, manufacturing process technology has evolved to enable RAM devices, such as DRAM, to be formed in high densities using specialized techniques. Unfortunately, RAM devices belong to a class of memory devices called volatile memory, meaning that the data stored in a RAM array is erased as soon as the power supply to the array is removed. Therefore, to maintain the integrity of data stored in a RAM array, power to the array must be maintained at all times. Unfortunately, this condition cannot be readily satisfied in mobile electronic devices, making volatile memory components such as RAM devices ill-suited for mobile applications in which data is required to be stored for extended periods of time.

Another type of memory device is known as read-only memory (ROM). This type of memory belongs to a class of memory devices called non-volatile memory because data stored in a ROM array is permanently fixed in the array until the array is intentionally erased. Even if the power supplied to the memory array of a ROM device is entirely removed, the data stored within the array is still maintained. Some common types of ROM memory devices include programmable ROM (PROM), erasable programmable ROM (EPROM), electrically erasable programmable ROM (EEPROM), and flash memory.

Data can be very quickly read from a flash memory device, nearly as fast or faster than the same data can be read from a RAM device. In addition, highly specialized manufacturing process technologies have been developed that enable high density flash arrays to be formed on a semiconductor substrate. For these reasons, flash memory devices are well suited for incorporation into mobile electronic devices for long-term storage of data. Unfortunately, it takes a long period of time to write data to a flash memory array. For example, it is not uncommon for it to take well over a thousand times as long to write data to a flash array as it does to read that data back out of the flash array. Moreover, erasing a particular block within the flash array before writing data to the block represents an even greater time delay.

SUMMARY OF THE INVENTION

One desire of the present invention is to provide a memory device for a computer system that supports fast read and write capability.

Another desire of the invention is to provide a memory device for a computer system that stores data in a nonvolatile manner.

An integrated circuit memory device comprising both volatile and nonvolatile memory arrays formed on a single semiconductor substrate is described. An interface is provided to couple the volatile memory array to the nonvolatile memory array. The interface is configured to write data to the volatile memory array, and to subsequently write that data from the volatile memory array to the nonvolatile memory array.

Other desires, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method and apparatus is described for providing a computer system with an integrated circuit (IC) memory device that is capable of supporting nonvolatile data storage with fast read and write capabilities. A RAM memory array is formed on the same semiconductor substrate as a flash memory array. An interface is provided that couples the RAM array to the flash array and to external devices. When data is to be written from an external device to the IC memory device, the data is initially written to the RAM array, thereby providing for quick execution of the write operation. This data is then subsequently written from the RAM array to the flash array via the interface in a manner that is relatively transparent to external devices and the user.

Upon receiving a read request from an external device, the interface of the IC memory device first searches for the requested data in the RAM array. If the requested data is not found in the RAM array, the data is read from the flash array and provided to the requesting external device. Thus, to an external device coupled to the IC memory device, the IC memory device appears to support both read and write operations at speeds typical of a RAM device, yet the IC stores data in a nonvolatile fashion like a ROM device. Moreover, integrating a RAM array together with a flash array on a single semiconductor substrate saves space, reduces interface redundancies (e.g., the same interface supports both the RAM and ROM), and supports the miniaturization of electronic devices.

The overall IC memory device structure will first be described in greater detail below to provide an overview as to how this device fits into and interfaces with a basic computer system. Then, a more detailed discussion of embodiments of the interface between the RAM array and the ROM array of the IC memory device will follow.

Figure 1:
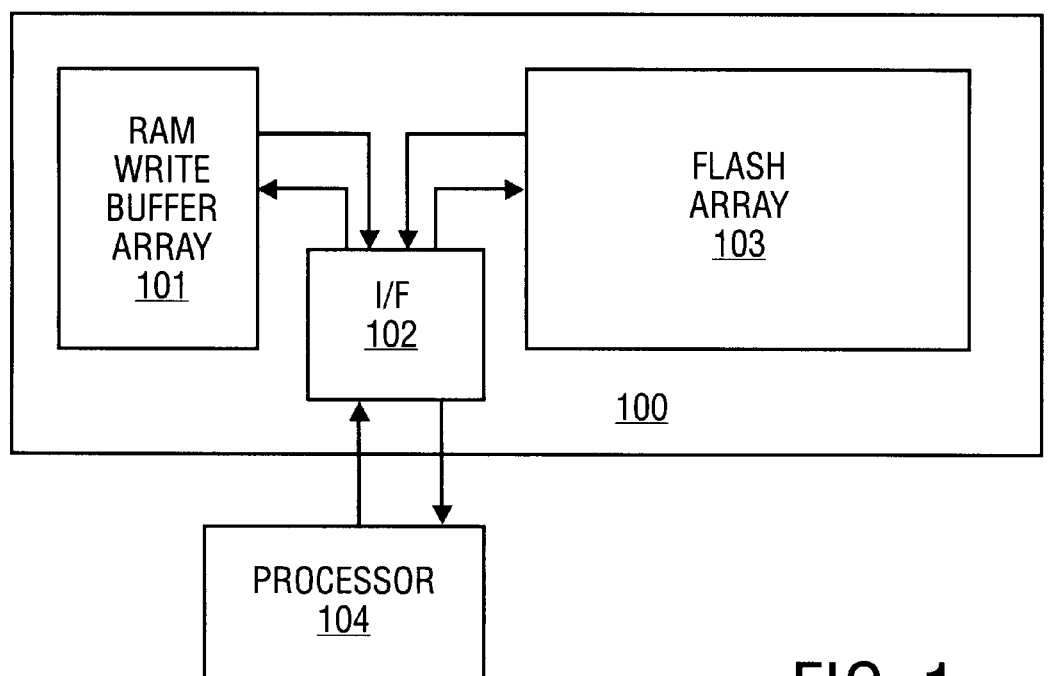
FIG. 1 is a block diagram of a computer system formed in accordance with an embodiment of the present invention.

FIG. 1 is a block diagram of a computer system formed in accordance with an embodiment of the present invention. The computer system comprises processor 104, coupled to interface 102, which is in turn coupled to RAM write buffer array 101 and flash array 103. RAM write buffer array 101, interface 102, and flash array 103 are formed together on a single semiconductor substrate to create IC memory device 100. For an alternate embodiment of the present invention, all or a portion of the interface that couples an external device to the internal memory arrays, as well as coupling the internal memory arrays to each other, resides on a separate semiconductor substrate. For one embodiment of the present invention, the RAM write buffer array of the IC memory device is formed using a RAM technology that supports relatively fast (in comparison to the flash array) read and write operations in a high density memory array format such as, for example, DRAM or SRAM arrays. In accordance with an alternate embodiment of the present invention, the flash array may be any suitable, nonvolatile, high density storage array such as, for example, EPROM or EEPROM.

IC memory device 100 incorporates three different manufacturing technologies on a single semiconductor substrate (or "chip"). RAM write buffer array 101 is formed using DRAM technology which includes, for example, a formation of trenched capacitors for charge storage to achieve maximum data storage density. Interface 102 primarily comprises logic gates and registers formed using complimentary metal oxide semiconductor (CMOS) manufacturing technology. Flash array 103 is formed using flash manufacturing technology that includes the formation of, for example, floating polysilicon gates, control gates, and highly doped source-drain regions for charge storage and removal.

For one embodiment of the present invention, IC memory device 100 is formed by combining DRAM, CMOS, and flash manufacturing process steps such that the DRAM process steps are applied to the RAM write buffer array region while interface 102 and flash array 103 are coated with protective layers, such as oxide, nitride, or polysilicon to protect these regions from the DRAM process steps. Similarly, the CMOS process steps are applied to the semiconductor substrate of IC memory device 100 to form interface 102, during which time RAM array 101 and flash array 103 are coated with protective layers. For this embodiment, flash array 103 is formed in a similar manner, whereby flash process steps are applied to this region of the semiconductor substrate while RAM array 101 and interface 102 are coated with protective layers. For an alternate embodiment of the present invention, a more intelligent combination of DRAM, CMOS, and flash semiconductor manufacturing technologies is implemented to minimize process steps, thereby reducing throughput time and defect density in the manufacturing of IC memory device 100. For example, the DRAM transistors of the RAM array are formed in conjunction with the CMOS logic transistors of the interface and the control gates of the flash array. In addition, early front-end process steps and back-end process steps, such as, for example, the formation of trench isolation regions and metal interconnect layers, respectively, are applied to the RAM array, interface, and flash array simultaneously as these process steps tend to be common across all three semiconductor manufacturing technologies.

In accordance with one embodiment of the present invention, the storage capacity of the RAM write buffer array is approximately equal to the storage capacity of the flash array. For this embodiment, upon activating the computer system of FIG. 1, the contents of flash array 103 are written to RAM array 101 so that nearly all memory accesses to IC memory device 100 are directed through interface 102 to RAM array 101. An advantage to this embodiment is that it simplifies the design of the interface coupling the flash array to the RAM array. Unfortunately, the semiconductor substrate surface area saved by simplifying the design of the interface may be more than offset by the large size of the RAM array. In addition, to preserve the non-volatility of data stored in the IC memory device, the entire contents of the large RAM array, must be reloaded back into the flash array before power to the device is shut off, and this may take an unacceptably long length of time.

For another embodiment of the present invention, the transistor count and, hence, the size of the IC memory device, is minimized by striking the proper balance between the memory capacity of the RAM write buffer array, the complexity of the interface, and the read and write execution speeds of the IC memory device. For example, by designing an interface that supports write merging of data into the RAM array, simultaneous reading of data from both the RAM array and the flash array, and background reading and writing between the RAM array and the flash array, the memory storage capacity of the RAM write buffer array can be made significantly smaller than the storage capacity of the flash array, while still providing more than adequate support for read and write operations to memory.

For one embodiment of the present invention, the interface of the IC memory device executes only a single read or a single write operation at any given time. For example, in response to a read request being issued by an external device to the IC memory device, the interface reads the requested data from the RAM array or the flash array during a first period of time. If a write request is issued to the IC memory device, the interface writes the data to either the RAM array or the flash array during a second period of time. The interface is also configured to write data either from the RAM array to the flash array or from the flash array to the RAM array during a third period of time.

For an alternate embodiment of the present invention, the RAM write buffer array, flash array, and interface of the IC memory device are configured to support simultaneous reading and writing between the two memory arrays and an external device or devices. For example, for one embodiment, data is read from the RAM array by an external device during at least a portion of a period of time in which data is written to the flash array from either the RAM array or an external device. For another embodiment, data is written to the RAM array from either an external device or the flash array during at least a portion of a period of time in which data is read from the flash array to an external device.

Figure 2:
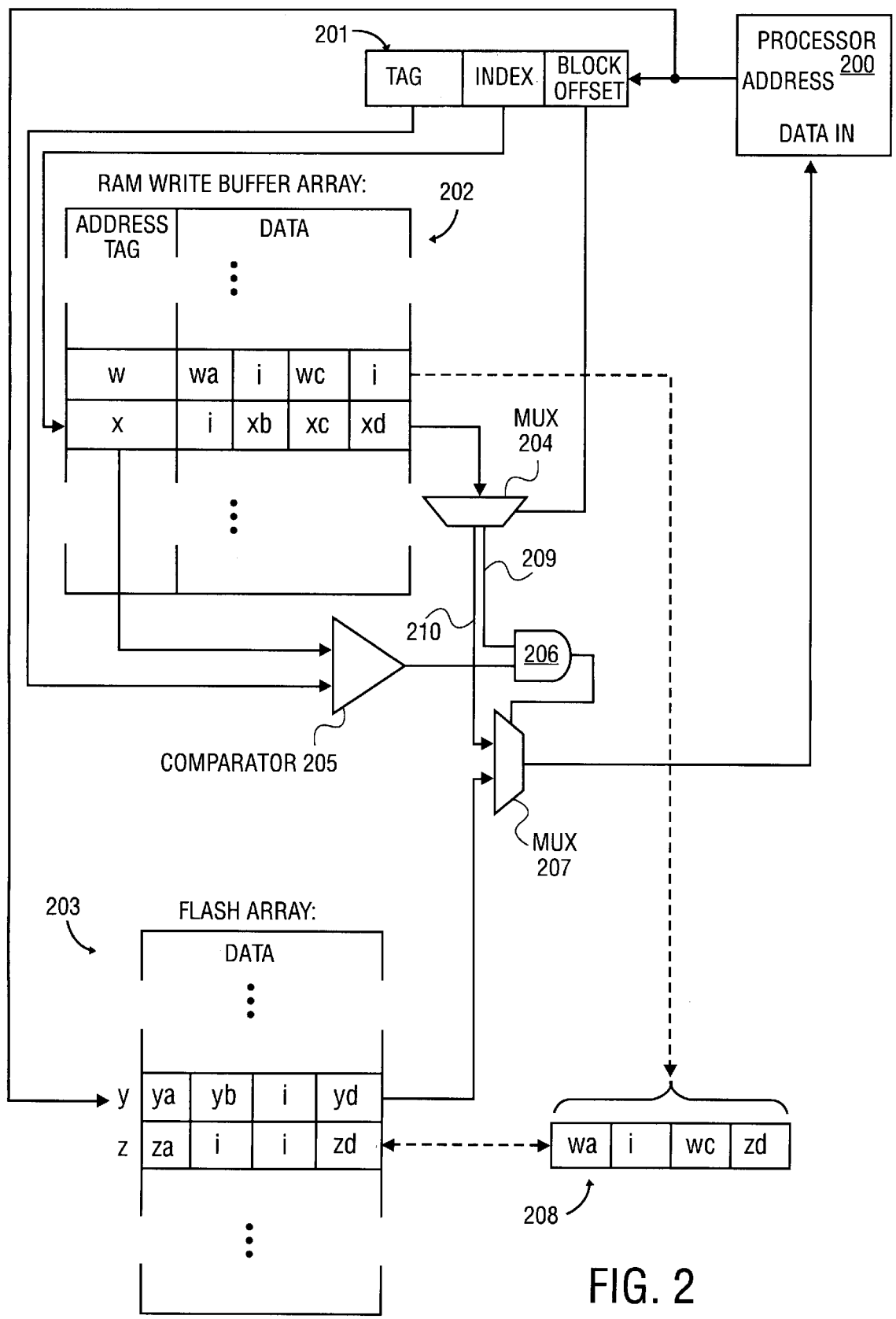
FIG. 2 is a schematic showing interface logic that executes a read operation in accordance with an embodiment of the present invention.

FIG. 2 is a schematic showing interface logic of the above-described IC memory device that executes a read operation in accordance with an embodiment of the present invention. An external device represented by processor 200 issues a read request to the IC memory device including the address 201 of the requested data. Address 201 contains three portions. The first portion, called the tag, contains the most significant bits of the address. The center portion, called the index, indicates the location within RAM write buffer array 202 where the data associated with address 201 may be located. The final portion of address 201 is called the block offset, and indicates a specific location within the block of data indicated by the index where a particular portion of data requested by processor 200 resides.

For the embodiment illustrated in FIG. 2, RAM write buffer array 202 is direct mapped such that data corresponding to a particular index can only be placed at a single location within the RAM write buffer array. For an alternate embodiment of the present invention, the RAM array is either set associative or fully associative.

Data is stored in RAM write buffer array 202 during write operations to the IC memory device (as described below in conjunction with FIG. 3). As described above, to increase the speed at which data is written to the IC memory device, the data is first written to the volatile RAM portion of the device before being transferred to the nonvolatile flash array in a manner that is nearly invisible to external devices in communication with the IC memory device. Therefore, data stored in the RAM array is data which may have been previously read from the flash array, possibly modified, and written back into the RAM array. Once this occurs, and before the data stored in the RAM array is written back into the proper address in the flash array, a read request issued by an external device for this data is satisfied by supplying the data from the RAM array rather than the flash array to ensure that the older, potentially stale data contained in the flash array is not used. On the other hand, if the requested data is not found inside the RAM array, then the data may be read from the flash array. In this manner, data coherency between the RAM write buffer array and the flash array is maintained.

Using the index field of address 201 of the data requested by processor 200, a location is identified within RAM write buffer array 202. At this location is stored an address tag x of the address of the data stored at that location, along with its corresponding data. An entire block of data is stored in the data field at the block address corresponding to address tag x of RAM array 202. Each of the four data elements, i, xb, xc, and xd, shown in the data block field of the block address corresponding to address tag x are 64 bit words, making for a total data block size of 32 bytes. For an alternate embodiment of the present invention, other block and data element sizes may be used. For one embodiment of the present invention, it may be found convenient to select a data block size that is equal to the block size within the flash array at the corresponding address.

The value x within the address tag field of RAM write buffer array 202 is provided to comparator 205 and compared to the tag field of address 201 of the requested data. If the two tags match, comparator 205 drives its output line high. If the tags do not match, comparator 205 pulls its output line low. Meanwhile, the data block at the block address corresponding to address tag x is provided to the input of multiplexer 204. Responsive to the block offset value of address 201, one of the four 64 bit data elements i, xb, xc, or xd, is selected and passed on to output line 210.

Note that, according to the nomenclature used in FIG. 2, any data element containing an i contains invalid data at that location. Invalid data is physically identified by a validity bit corresponding to each 64 bit data element. This validity bit is high (a logical "1") if the data is valid, and is low (a logical "0") if the data is invalid. The validity bit corresponding to the data element transferred to output line 210 of multiplexer 204 is applied to line 209.

The output of comparator 205 and the validity bit output line 209 of multiplexer 204 are applied to the input of AND gate 206. Output line 210 is applied to the input of multiplexer 207. Also applied to the input of multiplexer 207 is the requested data from flash array 203 at the appropriate address location y.

The output of AND gate 206 controls the input selection of multiplexer 207 ensuring that the data read from RAM array 202 will only be passed on through multiplexer 207 to the data input port of processor 200 if the tag field of address 201 matches the address tag x inside the RAM write buffer array, and the corresponding data element is valid. Otherwise, the data read from flash array 203, and provided to the input of multiplexer 207, is selected to be passed along to the data input port of processor 200. In this manner, data coherency between RAM write buffer array 202 and flash array 203 is maintained.

In accordance with one embodiment of the present invention, during any portion of the period of time in which the above-described read operation is taking place, the IC memory device interface is writing data in the background from RAM write buffer array 202 to flash array 203. As shown in FIG. 2 and as discussed in more detail below, the data associated with the block address corresponding to address tag w of RAM array 202 is merged with the data stored at the corresponding address z within flash array 203, and is stored back into flash array 203 at address z. The particular data selected from the RAM write buffer array to be written to the flash array may be selected by any of a number of methods. For example, for one embodiment, the least recently used data block (least recently written to or least recently read from) is selected for eviction from the RAM array and storage back into the flash array. For an alternate embodiment of the present invention, a random selection procedure is used. For another embodiment of the present invention, an external device specifically requests that data residing at a particular location within the RAM write buffer array be written from the RAM array to the flash array.

One limitation of flash memory arrays is that data bits cannot be individually erased. Instead, an entire block of data stored in the array must be erased at once. Before data can be written into a flash array at a location that already contains pre-existing data, the block containing that pre-existing data must be entirely erased. A flash merge buffer 208 is used to temporarily store and merge data from RAM write buffer array 202, and corresponding data from flash array 203, while the appropriate block within flash array 203 is erased. The merged data from the flash merge buffer is then written back into the block.

Merging of a data block from RAM array 202 with a corresponding data block from flash array 203 involves comparing each data element from the data block of the RAM array with each data element from the corresponding block of the flash array. If the data element stored in the RAM array is valid, it replaces its corresponding data element from the flash array in the merge buffer. If the data element stored in the RAM array is invalid, then the corresponding data element from the flash array replaces the invalid entry from the RAM array in the merge buffer. An example of this type of merging between the data block stored at the block address corresponding to address tag w of RAM write buffer array 202, and the data stored at flash block address z in flash array 203, is shown in flash merge buffer 208.

The first data element entry at the block address corresponding to address tag w, wa, is valid and so is entered at the first location within flash merge buffer 208. The next data element at the block address in the RAM array is invalid, and so the second entry within flash merge buffer 208 is taken from the corresponding data element in flash array 203, which also happens to be invalid. The third data element entry, wc, is valid and is placed in the third entry location of the flash merge buffer as shown. The last data element at the block address corresponding to address tag w is invalid, and so the corresponding data element, zd, is taken from the flash array, and placed in flash merge buffer 208 at the appropriate location as shown. For one embodiment of the present invention, the flash merge buffer exists at a special reserved address location within the RAM write buffer array. For another embodiment, the flash merge buffer exists within the flash array.

Figure 3:
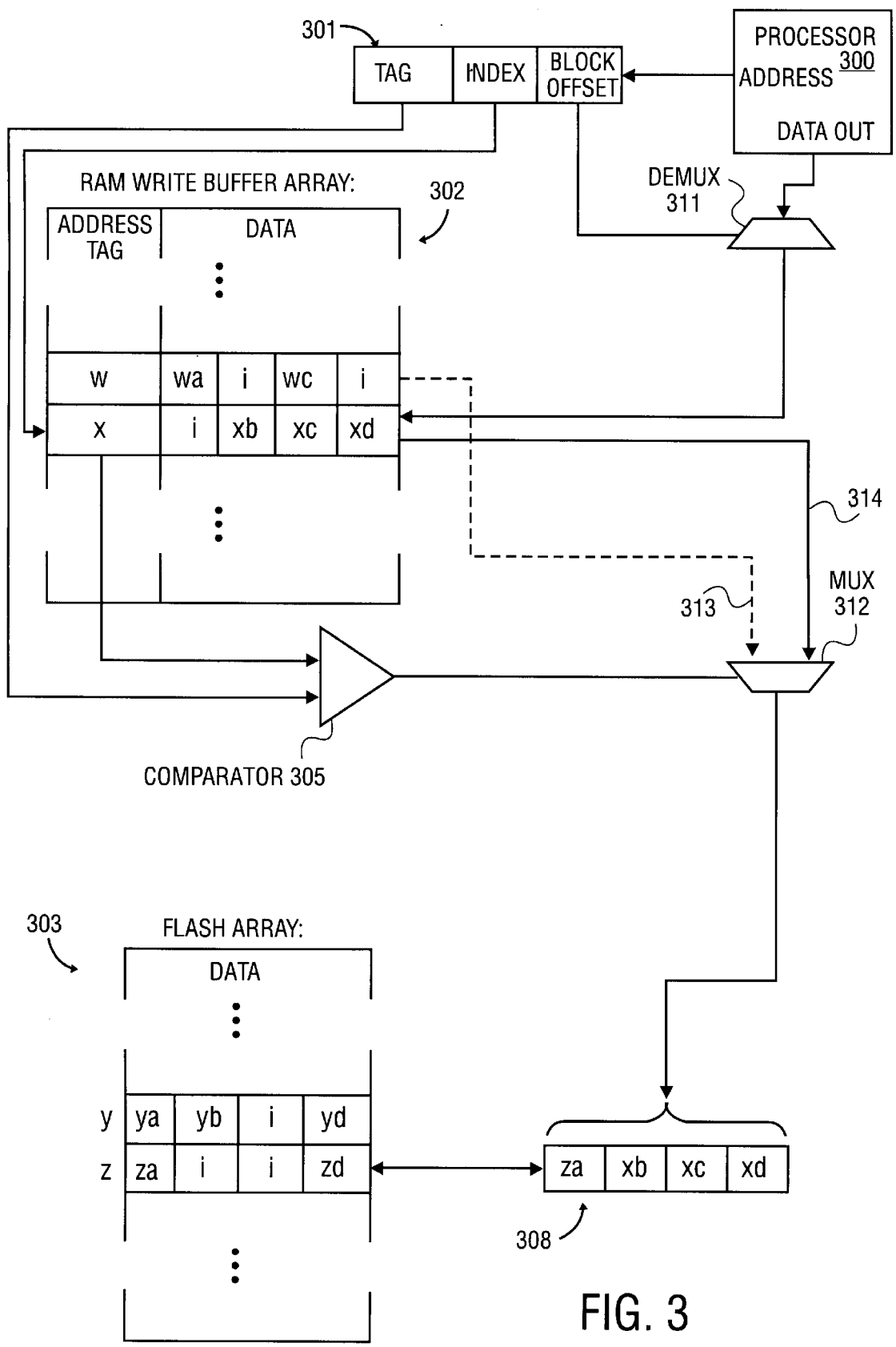
FIG. 3 is a schematic showing interface logic that executes a write operation in accordance with an embodiment of the present invention.

FIG. 3 is a schematic showing the interface logic that executes a write operation in accordance with an embodiment of the present invention. An external device represented by processor 300 issues a write request including the data to be written to the memory device and its corresponding address location. As described above, address 301 includes three fields. The index field selects the proper location within RAM write buffer array 302. The address tag x at this block address is provided to the input of comparator 305, and compared to the tag field of address 301.

The data provided by processor 300 to be written to the IC memory device is provided to the input of demultiplexer 311. This data is then shifted according to the block offset value of address 301 to the proper location within block address x. The data with the block address corresponding to address tag x is provided along line 314 to the input of multiplexer 312. Also provided as an input to multiplexer 312 is the data associated with the block address corresponding to address tag w for an embodiment of the present invention in which data is written from the RAM array to the flash array while data is being written from an external device to the RAM array. As explained above, the data selected for this background writing from the RAM array to the flash array is selected as the least recently used block of data, randomly, or in response to a specific instruction from an external device.

If the output of comparator 305 is high, indicating that address tag x matches the tag stored in the tag field of address 301, multiplexer 312 passes the data applied at input line 313 along to flash merge buffer 308, and the data provided at the output of processor 300 is merged into the block address corresponding to address tag x, replacing whatever data element was previously stored at that location. If the output from comparator 305 is low, this indicates that address tag x does not match the tag field of address 301. In this case, multiplexer 312 passes the data at input line 314 on to flash merge buffer 308, and the data provided by processor 300 entirely replaces the data previously stored at the corresponding block address invalidating all individual data elements within the block that are not written to. In addition, the new address tag value from the tag field of address 301 is stored in the address tag location within the corresponding block address.

Flash merger buffer 308 performs the same function as the flash merge buffer described above in conjunction with FIG. 2. In the example shown in FIG. 3, the address of the data written to the memory IC from processor 300 does not match the address stored in RAM write buffer array 302. Therefore, the old data at the block address corresponding to address tag x is entirely replaced by the new incoming data, and the old data is passed through multiplexer 312 to flash merge buffer 308 where it is merged with the data at block address z of flash array 303 as shown. After being merged, this data is then written back into the flash array.

Figure 4:
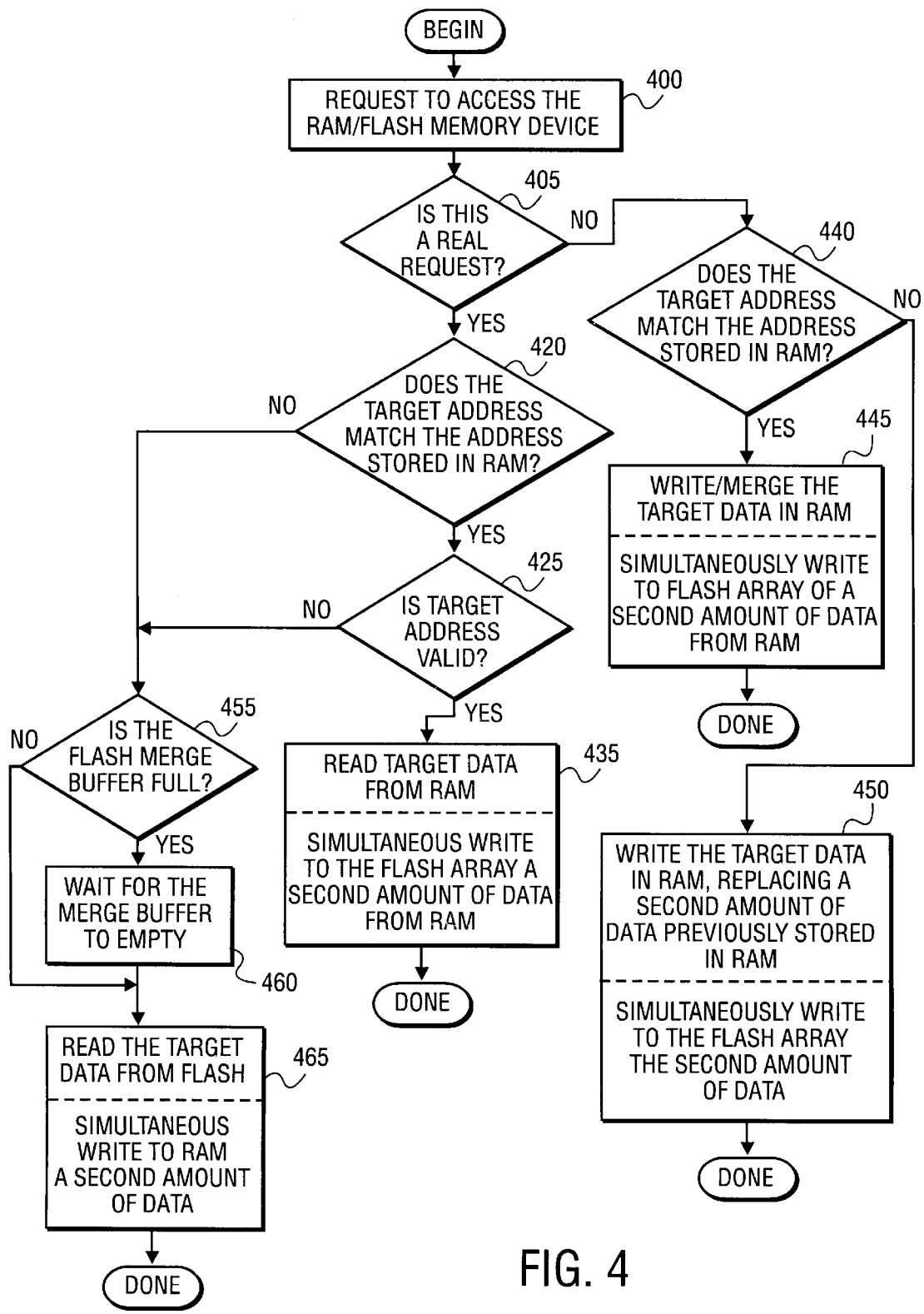
FIG. 4 is a flow chart showing the steps of a method for interfacing volatile and non-volatile memory arrays in accordance with an embodiment of the present invention.

FIG. 4 is a flow chart showing a method for interfacing volatile and non-volatile memory arrays. At step 400, an external device makes a request that involves accessing an IC memory device that, for one embodiment of the present invention, is a RAM/flash memory device that incorporates both a RAM array and a flash memory array together on a single semiconductor substrate. At step 405, an interface provided for the memory device first determines if the request issued by the external device is a read or write request. If the request is a read request, the interface next determines if the address corresponding to the data to be read, called the target address, matches an address stored in the RAM portion of the memory device at step 420.

If there is a match, the interface must further determine if the data that is the target of the read request, called the target data, is valid at step 425. If the target data is not valid, or if the target address does not match the address stored in RAM, the interface must determine if the flash merge buffer is full at step 455. The purpose for this determination is that if the flash merge buffer is full, and the target data happens to be stored in the flash merge buffer, older and possibly stale or invalid data will be read from the flash memory portion of the memory device before the new data is uploaded into the flash array from the flash merge buffer.

Therefore, if the flash merge buffer is full, the memory device interface waits for the merge buffer to empty at step 460 before reading the target data from the flash array. If the flash merge buffer is not full, then the interface of the memory device can skip directly to reading the target data from the flash array at step 465. For one embodiment of the present invention during at least a portion of the period of time in which the target is being read from the flash memory array of the RAM/flash IC memory device, a second amount of data is written to the RAM array of the memory device from, for example, another external device coupled to the IC memory device at step 465.

Alternatively, if the target address matches the address stored in RAM, and the target data is valid, then the target data is read from the RAM portion of the memory device at step 435. During at least a portion of the period of time in which the target data is being read from RAM, a simultaneous write operation is executed that writes a second amount of data from RAM to the flash memory array in accordance with one embodiment of the present invention. Note that this write operation, in accordance with one embodiment of the present invention, includes the intermittent step of merging data into the flash merge buffer before writing the block back into the flash memory array.

If the interface of the RAM/flash IC memory device determines that the access request issued by an external device is for a write operation at step 405, then the interface next determines if the target address matches the address stored in RAM at step 440. If a match is found, the target data is written into the appropriate location within the RAM array by merging the target data with the data already stored in the RAM array at step 445. During at least a portion of the period of time in which the target data is written into the RAM portion of the memory device, a second amount of data is simultaneously written from the RAM array to the flash memory array at step 445 in accordance with one embodiment of the present invention.

If, however, it is determined that the target address does not match the address stored in RAM at step 440, then the target data is written into RAM replacing a second amount of data previously stored at the target block address. For one embodiment, the IC memory device writes the target data into RAM replacing data previously stored at the target block address by setting the value of validity bits within the block to "0" at step 450. For one embodiment of the present invention, the second amount of data that is evicted from the RAM array is simultaneously written from the RAM array to the flash array during at least a portion of the period of time in which the target data is written into RAM at step 450.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An integrated circuit (IC) memory device comprising:

a random access memory (RAM) write buffer array formed on a single semiconductor substrate to store data elements in a plurality of data blocks in connection with write operations to the IC memory device;

a flash memory array formed on the single semiconductor substrate to store data elements from the RAM write buffer array;

a flash merge buffer formed on the single semiconductor substrate to temporarily store and merge data elements from the RAM write buffer array and the flash memory array; and an interface coupling the RAM write buffer array, the flash memory array, and the flash merge buffer, the interface to compare each data element within a data block of the RAM write buffer array with each data element from a corresponding block within the flash memory array, to determine if data elements stored in the RAM write buffer array are valid, to replace the corresponding data element from the flash memory array in the flash merge buffer with the data element stored in the RAM write buffer array if the data element stored in the RAM write buffer array is valid, and to replace the invalid data element from the RAM write buffer array in the flash merge buffer with the corresponding data element from the flash memory array if the data element is invalid.

2. The IC memory device of claim 1, wherein the interface is enabled to receive a read request for first data, to read the first data from the RAM write buffer array if the first data is stored in the RAM write buffer array and is valid otherwise read the first data from the flash memory array.

3. The IC memory device of claim 1, wherein the interface is enabled to write second data to the RAM write buffer array during at least a portion of a period of time in which the first data is read from the flash memory array.

4. The IC memory device of claim 3, wherein the interface is enabled to write the second data from the RAM write buffer array to the flash memory array during at least a portion of a period of time in which the first data is read from the RAM write buffer array.

5. The IC memory device of claim 4, wherein the interface is enabled to write the second data from the RAM write buffer array to the flash memory array during at least a portion of a period of time in which the first data is written to the RAM write buffer array.

6. A method comprising:

determining if a read request for first data corresponding to a first address has been issued from an external device;

determining if the first address matches an address in a RAM write buffer array, and, if not, reading the first data from a flash memory array; and ensuring that a flash merge buffer is empty before reading the first data from the flash memory array.

7. The method of claim 6, further comprising:

determining if data stored in the RAM write buffer array is valid, and if the data is valid, reading the first data from the RAM write buffer array.

8. The method of claim 6, further comprising:

writing a second data to the RAM write buffer array during at least a portion of a period of time in which the first data is read from the flash memory array.

9. The method of claim 6, further comprising:

writing a second data from the RAM write buffer array to the flash memory array during at least a portion of a period of time in which the first data is read from the RAM write buffer array.

\* \* \* \* \*